US007008818B2

(12) United States Patent
Liu et al.

(10) Patent No.: US 7,008,818 B2
(45) Date of Patent: Mar. 7, 2006

(54) FLIP CHIP PACKAGING PROCESS EMPLOYING IMPROVED PROBE TIP DESIGN

(75) Inventors: Hung-Min Liu, Hsin-Chu (TW); Kow-Bao Chen, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/907,702

(22) Filed: Apr. 12, 2005

(65) Prior Publication Data

US 2005/0164428 A1 Jul. 28, 2005

Related U.S. Application Data

(62) Division of application No. 10/604,611, filed on Aug. 5, 2003.

(51) Int. Cl.
*H01L 21/50* (2006.01)

(52) U.S. Cl. ........................................ 438/106; 438/108

(58) Field of Classification Search ................ 438/106, 438/108, 585, 597
See application file for complete search history.

(56) References Cited

U.S. PATENT DOCUMENTS

| | | | |
|---|---|---|---|
| 5,641,315 A | | 6/1997 | Swart et al. |
| 5,731,710 A | | 3/1998 | Mizuno et al. |
| 6,165,887 A | * | 12/2000 | Ball ........................... 438/613 |
| 6,405,584 B1 | | 6/2002 | Bindell et al. |
| 6,544,239 B1 | | 4/2003 | Kinsey et al. |
| 6,603,297 B1 | | 8/2003 | Gessford et al. |
| 6,674,297 B1 | | 1/2004 | Florence, Jr. et al. |
| 2002/0052129 A1 | | 5/2002 | Cabintos |
| 2003/0057952 A1 | | 3/2003 | Derr |

* cited by examiner

*Primary Examiner*—Scott Geyer
(74) *Attorney, Agent, or Firm*—Winston Hsu

(57) ABSTRACT

The present invention provides a novel probe tip suited for flip-chip packaging process. The probe tip comprises a needle body; and a stop cylinder having a recess for fittingly accommodating the needle body therein, the needle body being electrically connected to the stop cylinder via a resilient conductive material. The stop cylinder has an annual flat bottom surrounding the needle body for pressing a protruding probe mark on a metal pad scratched by the needle body.

8 Claims, 13 Drawing Sheets

FLIP CHIP PACKAGING PROCESS EMPLOYING IMPROVED PROBE TIP DESIGN

CROSS REFERENCE TO RELATED APPLICATIONS

This is a division application of U.S. patent application Ser. No. 10/604,611 filed Aug. 5, 2003 by Liu et al.

BACKGROUND OF INVENTION

1. Field of the Invention

The present invention relates generally to flip-chip packaging processes, and more particularly, to a flip-chip packaging process utilizing an improved probe tip design for implementing a probing process.

2. Description of the Prior Art

For chip-to-carrier interconnection, IBM uses its Controlled Collapse Chip Connection (C4) technology, widely known as Flip-Chip Attach (FCA). C4 and flip-chip provide high I/O density, uniform chip power distribution, superior cooling capability, and high reliability. Originally developed for use with ceramic carriers in connection with the Solid Logic Technology (SLT) introduced by IBM in the early 1960s, C4 is a process that uses 97/3% PbSn solder balls with diameters ranging from 100 to 125 microns as a chip-to-carrier interconnect. An array of these balls or bumps are arranged around the surface of a chip, either in an area or peripheral configuration. The chip is placed face down on a carrier that has been prepared with corresponding metallized pads that have been flashed with gold to prevent corrosion. When heat is applied, the solder re-flows to the pads.

Please refer to FIG. 1. FIG. 1 illustrates a conventional flip-chip packaging process flow. As shown in FIG. 1, typically, after finishing the fabrication of semiconductor devices on semiconductor wafers (Step 1), the semiconductor wafers are thereafter transferred to a subcontractor for bumping (Step 2). This bumping process usually takes 5 to 7 days, followed by a 2-day electrical probing test (Step 3) that is carried out in a testing house. After undergoing the electrical test, the wafers are then transferred to a package house in which microchips are placed face down on a substrate such as a printed circuit board that has been prepared with corresponding pads. When heat is applied, the solder re-flows to the pads and the chips are connected to substrates (Step 4). This flip-chip packaging process takes another 5 to 7 days.

However, the above-mentioned flip-chip packaging process flow encounters many problems. One of the problems in using the conventional flip-chip packaging process flow is that since the probing test is carried out after the bumping process (it needs 5 to 7 days to be finished as mentioned), the important yield feedback information is delayed for 5 to 7 days. When fabrication processes of this batch of wafers went wrong, this yield feedback information will only be known after the bumping process is done. Consequently, the risk is high for an IC chip manufacturer. A second problem in utilizing the conventional flip-chip packaging process flow is that the yield result covers both the fabrication processes of this batch of wafers and also the subsequent bumping process. Sometimes, it is difficult to distinguish the source of the yield loss. Further, according to the prior art flip-chip packaging process flow, it takes 12 to 16 days in total to finish flip-chip packaging. As mentioned, the wafers have to be transferred from wafer foundry to a subcontractor for bumping, then to a testing house for probing test, then to package house for chip-substrate connection. Accordingly, there is a need to provide a new, reliable and simplified flip-chip packaging process flow for the chipmakers to solve the above-mentioned problems.

SUMMARY OF INVENTION

The primary objective of the present invention is to provide a new flip-chip packaging process flow in which a probing test is arranged prior to the bumping process to shrink yield feedback time, and to reduce the entire process time for packaging.

Another objective of the present invention is to provide a novel probe tip design utilized in the probing test within the flip-chip packaging process flow. The novel probe tip design can effectively control the elevation of a protruding probe mark and therefore makes the new flip-chip packaging process flow of this invention practical.

According to the claimed invention, a new flip-chip packaging process is provided. A chip having thereon at least one metal pad surface is first prepared. A probe tip comprising a needle body and a stop cylinder for accommodating the needle body therein is provided. The needle body is electrically connected to the stop cylinder via a resilient conductive material. The needle body of the probe tip is laterally moved to scratch a portion of the metal pad surface so as to form a protruding probe mark thereon. The protruding probe mark is pressed with the stop cylinder to a predetermined height. A under bump metallurgy (UBM) is then formed over the metal pad surface. A solder bump is finally formed over the UBM.

The present invention provides a novel probe tip suited for flip-chip packaging process. The probe tip comprises a needle body; and a stop cylinder having a recess for fittingly accommodating the needle body therein, the needle body being electrically connected to the stop cylinder via a resilient conductive material. The stop cylinder has an annual flat bottom surrounding the needle body for pressing a protruding probe mark on a metal pad scratched by the needle body.

These and other objectives of the present invention will no doubt become obvious to those of ordinary skill in the art after reading the following detailed description of the preferred embodiment that is illustrated in the various figures and drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
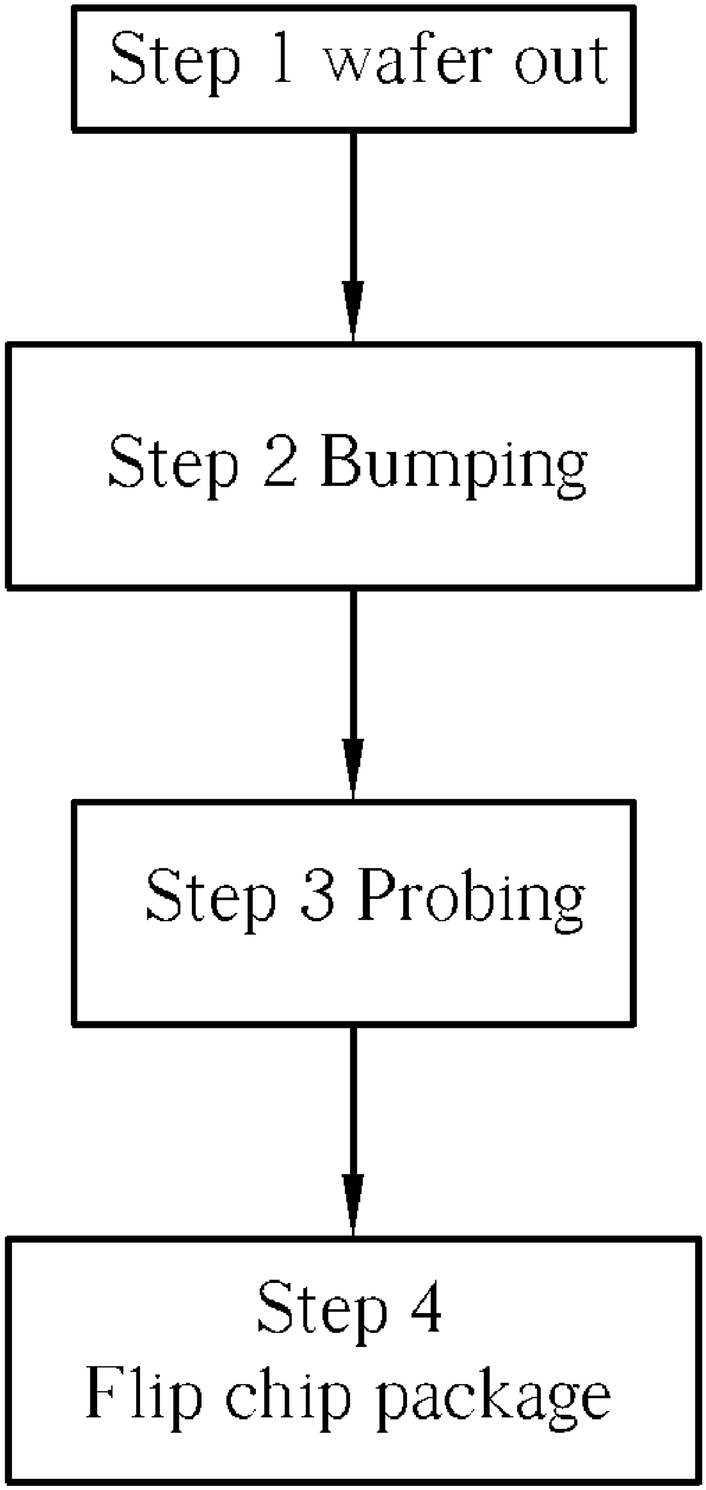
FIG. 1 illustrates a conventional flip-chip packaging process flow.
Figure 2:
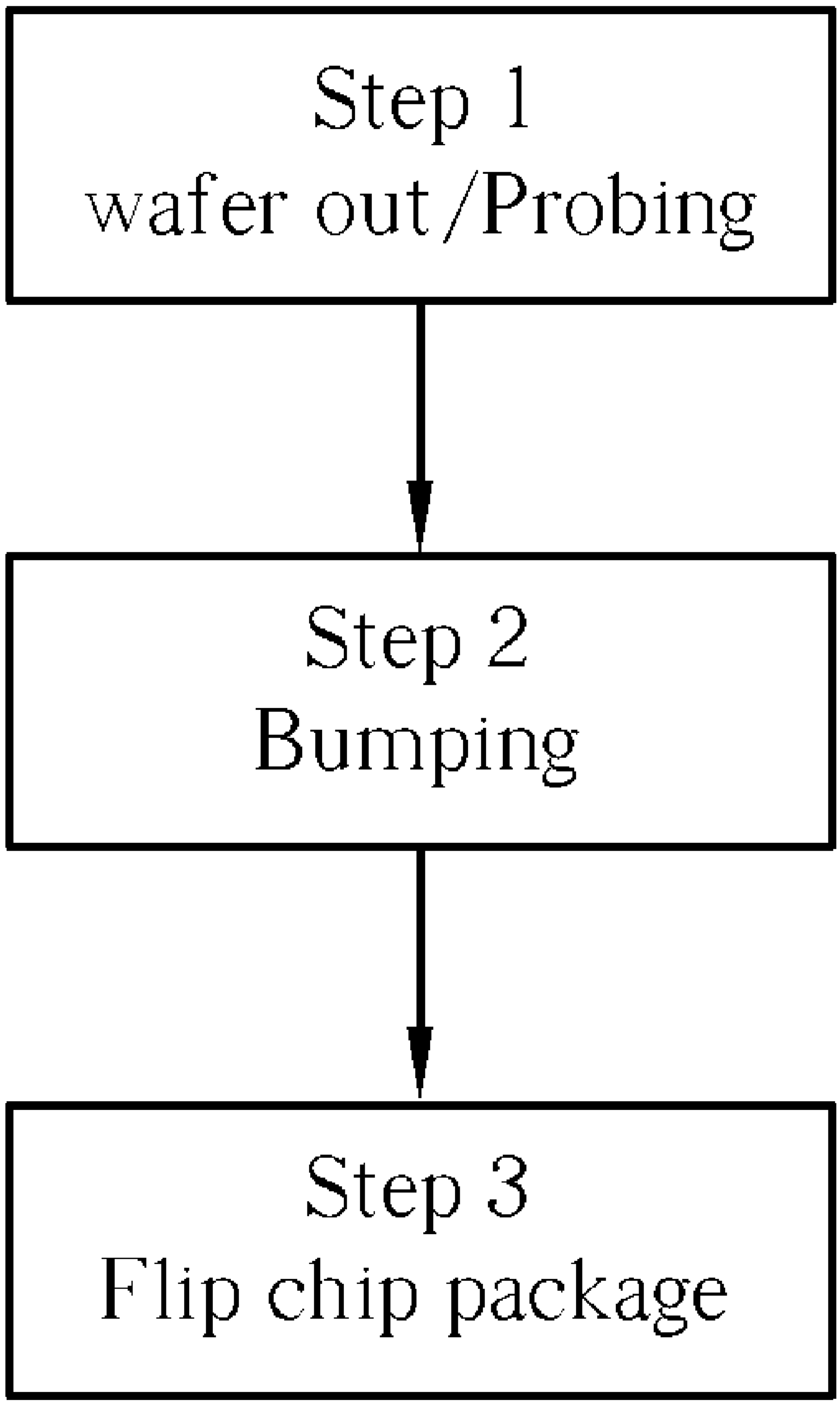
FIG. 2 is a flowchart of flip-chip packaging process according to the present invention.

Please refer to FIG. 2. FIG. 2 is a flowchart of a novel flip-chip packaging process according to the present invention. As shown in FIG. 2, after finishing the fabrication of semiconductor devices on semiconductor wafers (Step 1), the semiconductor wafers are immediately transferred to a testing house for an electrical probing test. Alternatively, probing of the semiconductor wafers may be done by chipmakers themselves. By doing this, when fabrication processes of this batch of wafers went wrong, the yield feedback information will be known immediately. After that, the semiconductor wafers are transferred to a subcontractor for bumping (Step 2). Likewise, this bumping process usually takes 5 to 7 days. After bumping, the wafers are then transferred to a package house in which microchips are placed face down on a substrate such as a printed circuit board that has been prepared with corresponding pads. When heat is applied, the solder re-flows to the pads and the chips are connected to substrates. However, the above-mentioned process flow is impractical when utilizing a prior art probe tip during a probing process. Now, the problem in utilizing a prior art probe tip design during a probing process will be explained in detail with reference to FIG. 3*a* to FIG. 3*e*.

Figure 3A:
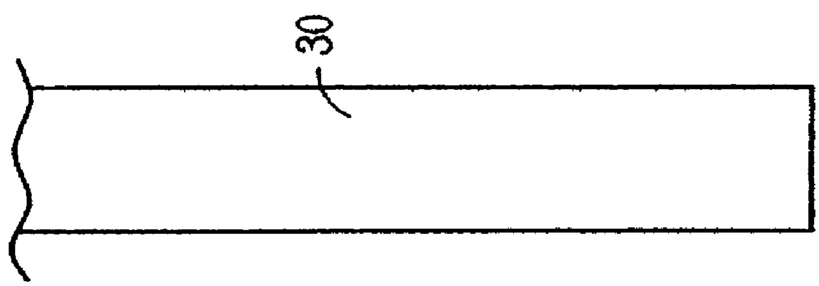
FIG. 3*a* is an enlarged side view of a prior art probe tip.
Figure 3B:
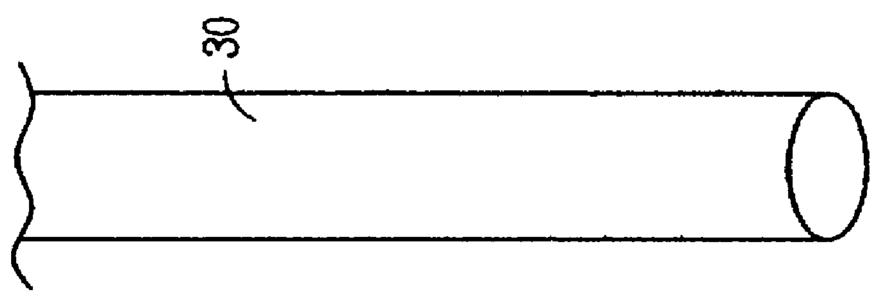
FIG. 3*b* is a perspective view of the prior art probe tip 30 of FIG. 3*a*.
Figure 3C:
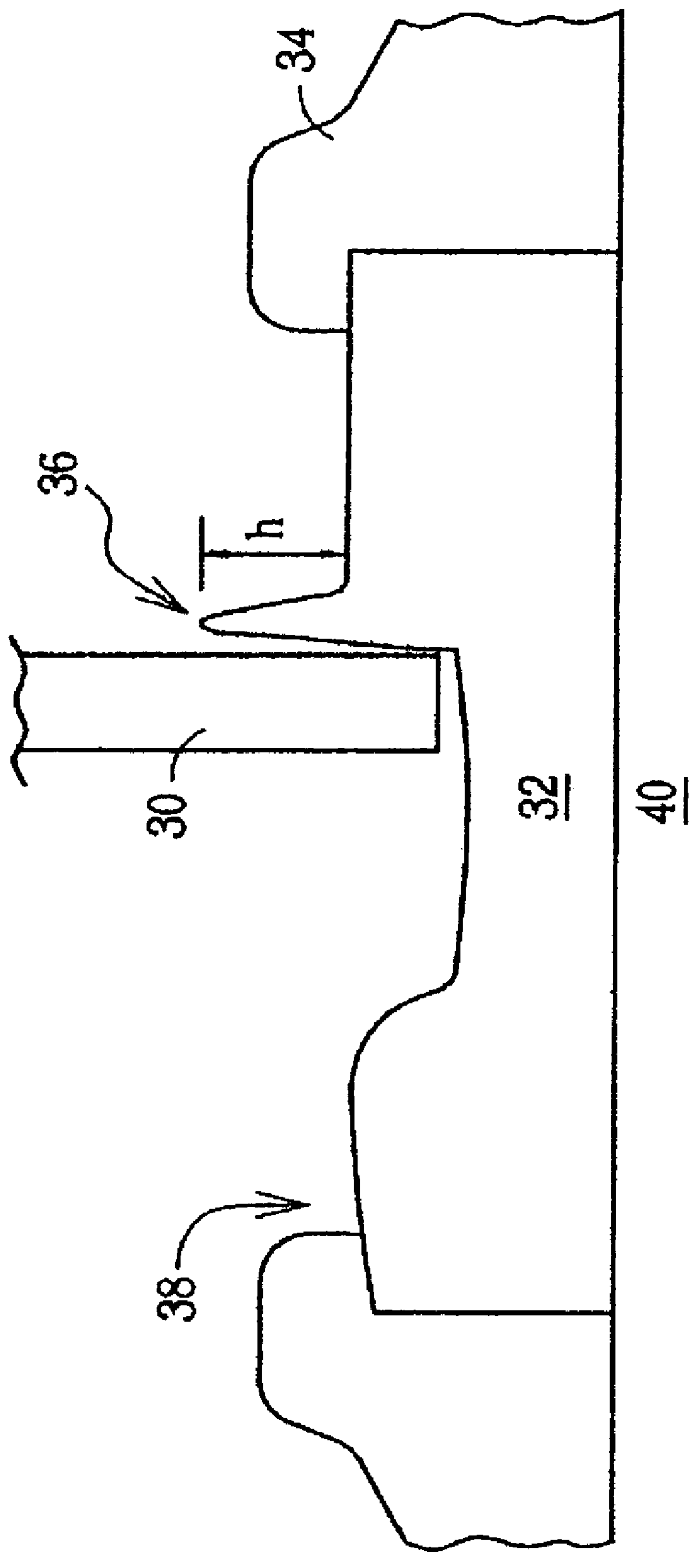
FIG. 3*c* is a cross-sectional, schematic diagram illustrating a transition state during the probing process utilizing the prior art probe tip.

First, referring to FIG. 3*a* to FIG. 3*c*, where FIG. 3*a* is an enlarged side view of a prior art probe tip 30, FIG. 3*b* is a perspective view of the prior art probe tip 30 of FIG. 3*a*, and FIG. 3*c* is a cross-sectional, schematic diagram illustrating a transition state during the probing process utilizing the prior art probe tip 30. As best seen in FIG. 3*c*, on the chip 40 there is deposited an aluminum or copper metal pad 32. The metal pad 32 is initially covered by a passivation layer 34. An etching process is then implemented to form a via opening 38 exposing a portion of the underlying metal pad 32. The prior art probe tip 30 is moved down to touch the metal pad 32 through the via opening 38. To prevent the interference of the metal oxide formed on the surface of the metal pad 32 and to ensure good contact between the probe tip and the metal pad, the prior art probe tip 30 begins to laterally move a short distance on the surface of the metal pad 32. This action results in an uplifted probe mark 36 at a height of h. In practice, h ranges from 3 microns to 4 microns, or even higher. As indicated in FIG. 3*a* through FIG. 3*c*, the prior art probe tip cannot control the height h of the protruding probe mark 36.

Figure 3D:
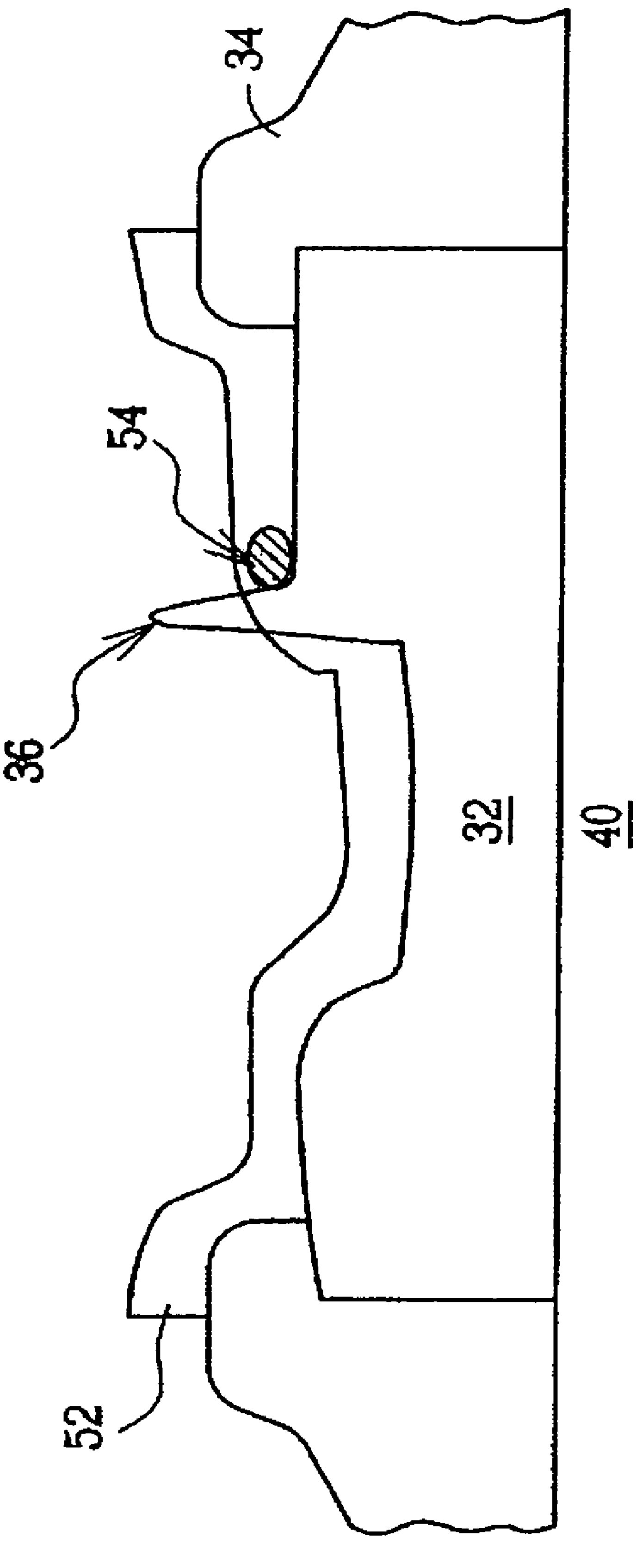
FIG. 3*d* and FIG. 3*e* illustrate the bumping process.
Figure 3E:
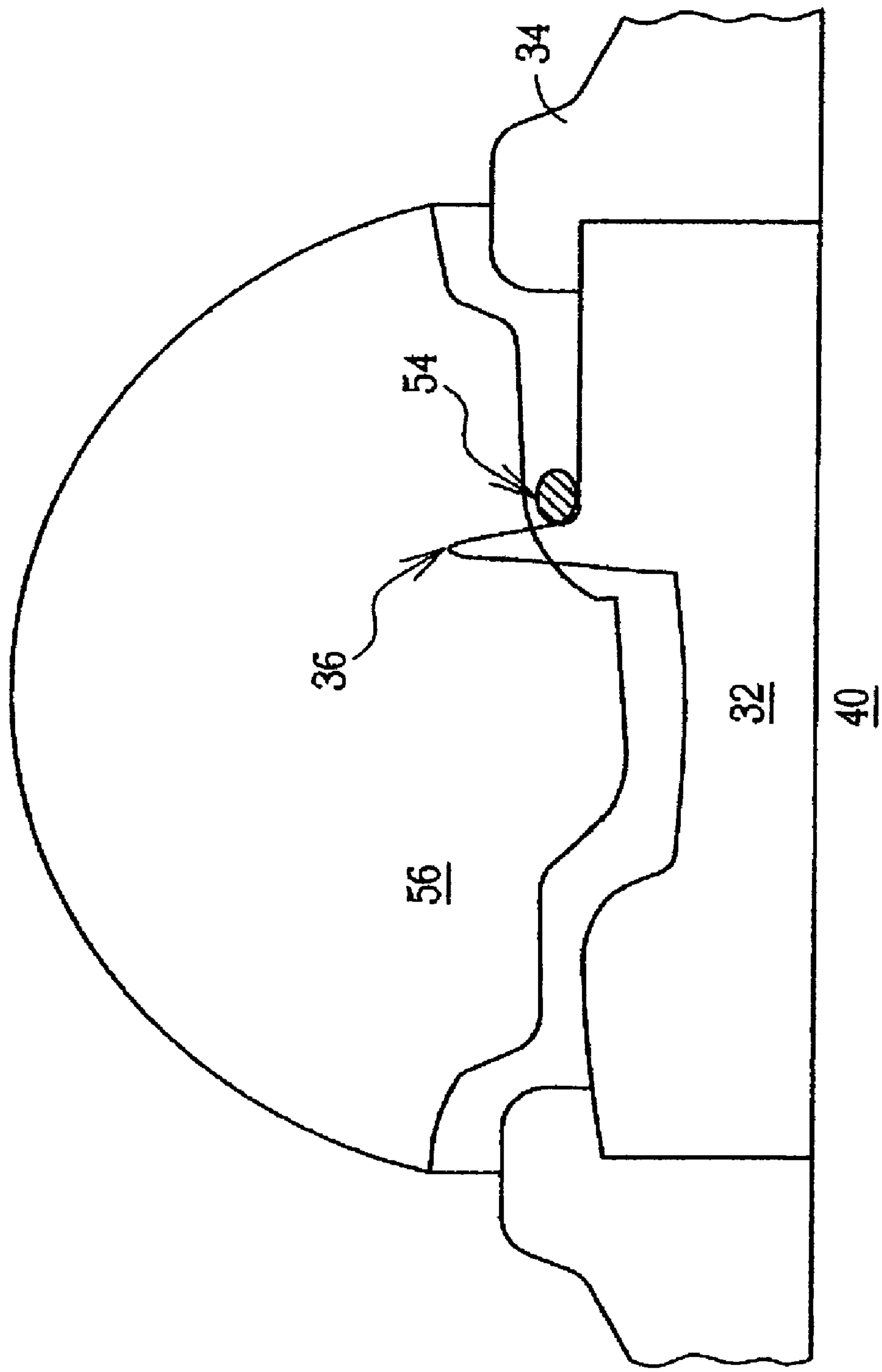

FIG. 3*d* and FIG. 3*e* illustrate the following bumping process. As shown in FIG. 3*d*, an under bump metallurgy (UBM) 52 is formed on the surface of the metal pad 32. The formation of the UBM 52 is known in the art. Typically, the UBM 52 comprises an adhesion layer made of Ti, Cr, or Al, a diffusion barrier layer such as Cu, Ni, or TiW alloy, and a wetting layer such as Cu, Ni, Au, or Ag, but not limited thereto. The thickness of the UBM 52 is about 1 micron to 2 microns. As specifically indicated in FIG. 3*d*, the protruding probe mark 36 having a height h of 3 microns to 4 microns protrudes from the surface of the UBM 52. Further, at one side of the probe mark 36 in the UBM 52 a void 54 is formed. The formation of the void 54 results in undesirable electromigration. As shown in FIG. 3*e*, a solder bump 56 is thereafter formed on the UBM 52. In a case that the solder bump 56 is formed by using electrical plating, the existence of the protruding probe tip 36 will create spike discharge during the plating of the solder bump 56, thereby affecting the uniformity of bump array. In a worse case, bridging of bump array occurs. Furthermore, the protruding portion of the probe mark 36 is naked, that is, not covered by the UBM 52. Without the barrier of the UBM 52, a bump crack phenomenon is observed due to the diffusion of Sn of the solder bump 56 and the diffusion of the underlying Al pad.

Figure 4A:
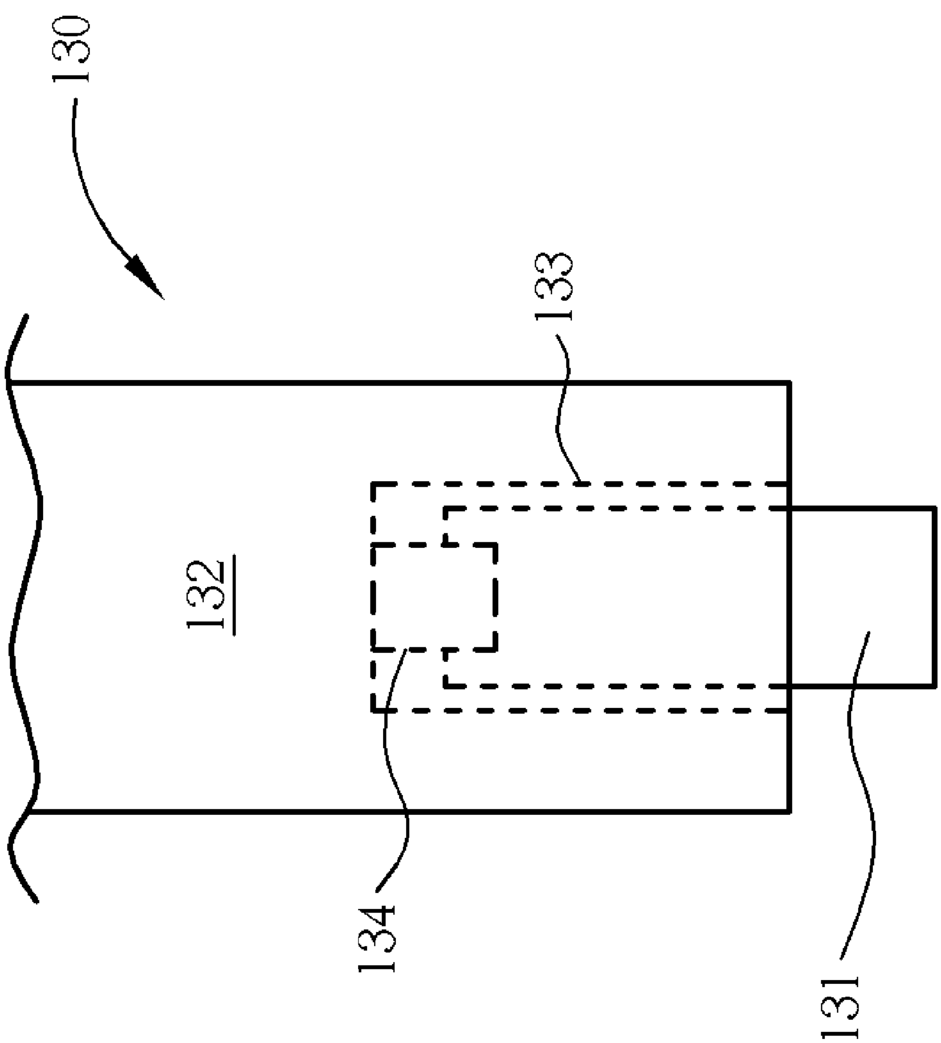
FIG. 4*a* is an enlarged side view of a probe tip in accordance with the present invention
Figure 4B:
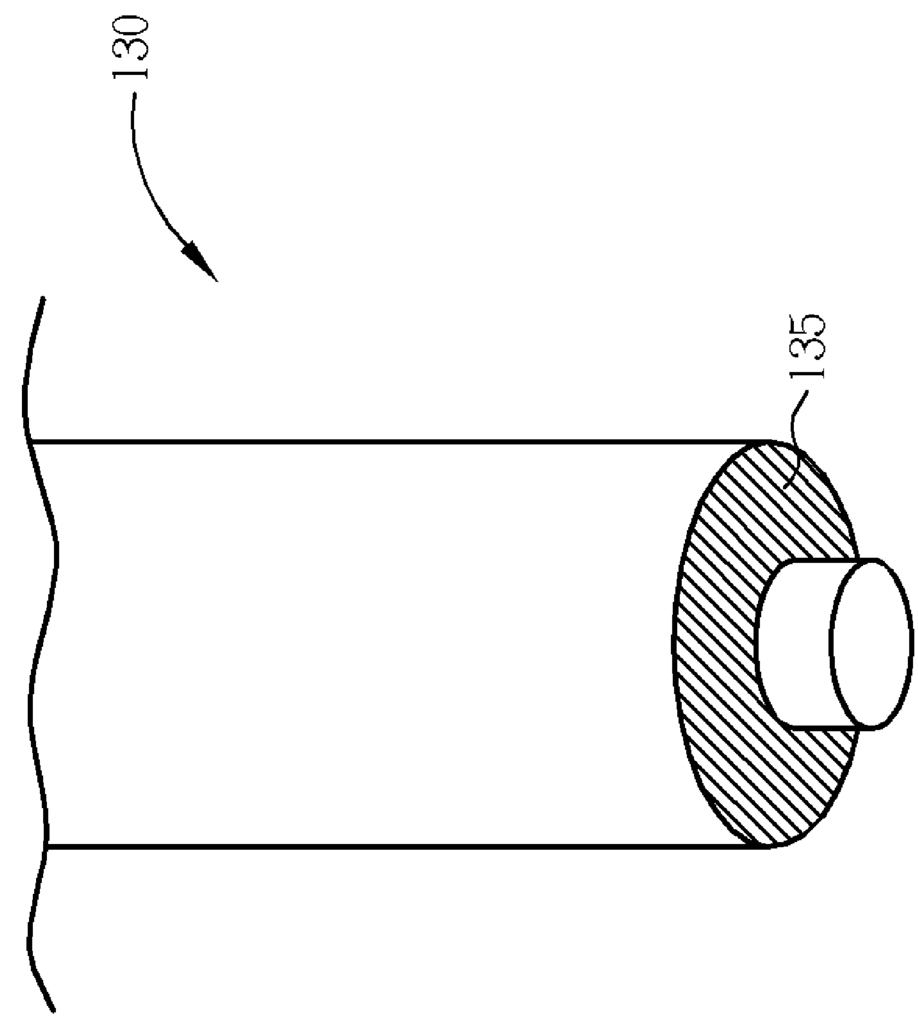
FIG. 4*b* is a perspective view of the probe tip of FIG. 4*a*.

To solve the above-mentioned problems and to make the novel flip-chip packaging process flow of this invention practical, a novel probe tip design is proposed. Please refer to FIG. 4*a* and FIG. 4*b*. FIG. 4*a* is an enlarged side view of a probe tip 130 in accordance with the present invention, and FIG. 4*b* is a perspective view of the probe tip 130 of FIG. 4*a*. As shown in FIG. 4*a* and FIG. 4*b*, the probe tip 130 comprises a needle body 131 and a stop cylinder 132. The stop cylinder 132 has an opening 133 at the bottom of the stop cylinder 132 for accommodating the needle body 131. The needle body 131 is electrically connected to the stop cylinder 132 via flexible conductive glue 134. According to the preferred embodiment of the present invention, the diameter of the needle body 131 is about 20 microns to 30 microns, and the width of the annual region (shadow area) 135 at the bottom of the stop cylinder 132 is about 20 microns, but not limited thereto.

Figure 4C:
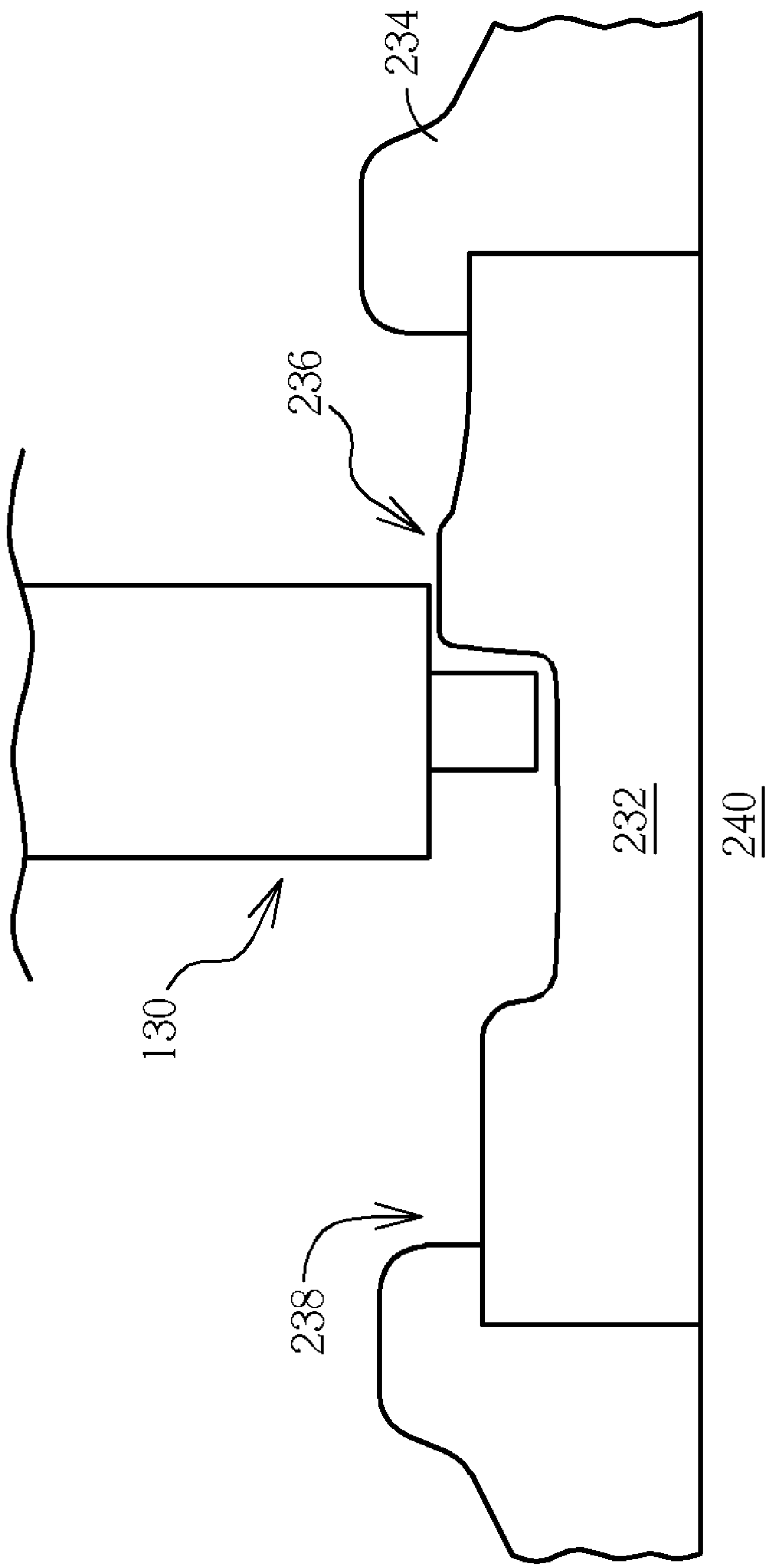
FIG. 4*c* is a cross-sectional, schematic diagram illustrating a transition state during the probing process utilizing the novel probe tip.
Figure 4D:
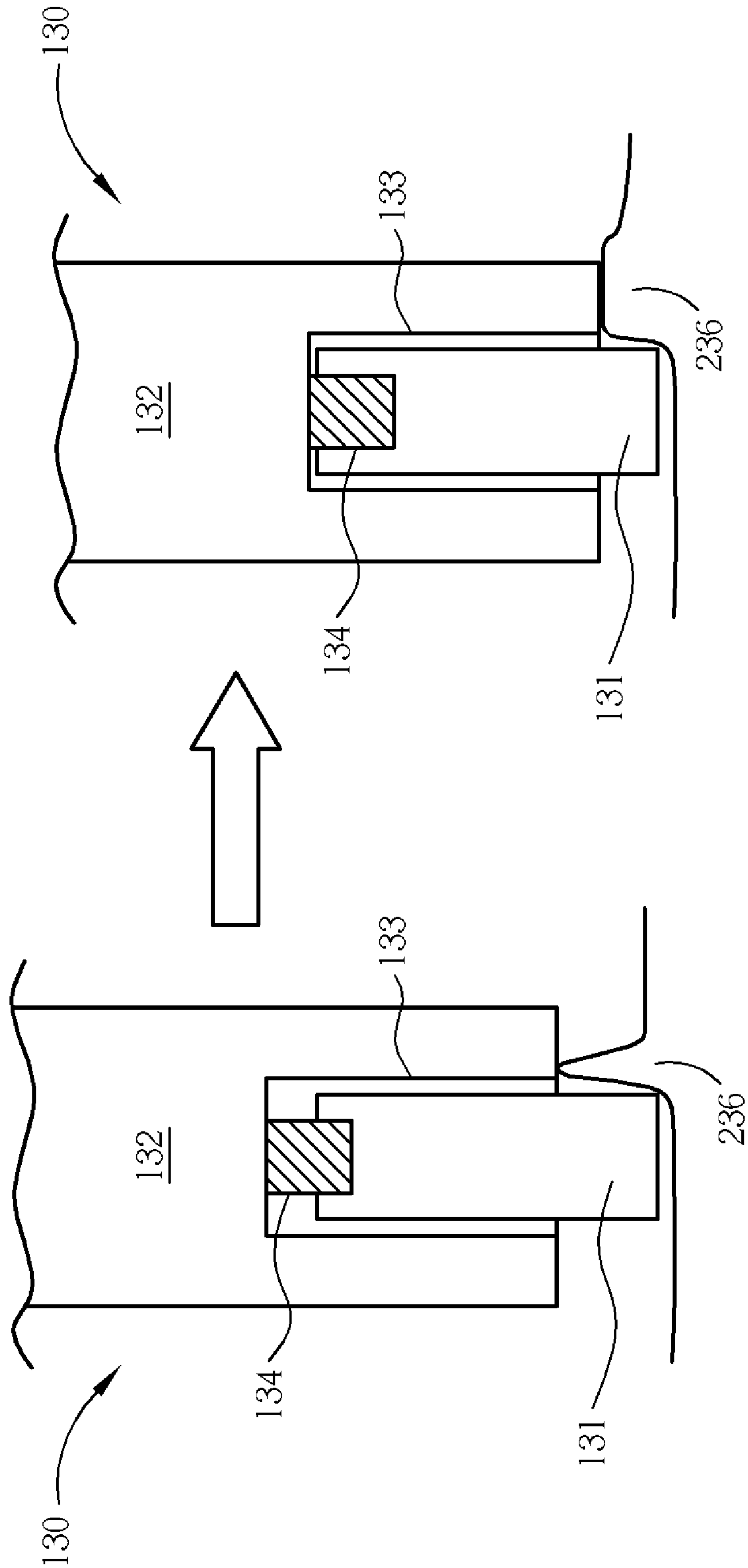
FIG. 4*d* illustrates the use of the probe tip of this invention for controlling the height of protruding probe mark during a probing test.

Please refer to FIG. 4*c*. FIG. 4*c* is a cross-sectional, schematic diagram illustrating a transition state during the probing process utilizing the novel probe tip 130. As shown in FIG. 4*c*, on the chip 240 there is deposited an aluminum or copper metal pad 232. Likewise, the metal pad 232 is initially covered by a passivation layer 234. An etching process is then implemented to form a via opening 238 exposing a portion of the underlying metal pad 232. The probe tip 130 is moved down to touch the metal pad 232 through the via opening 238. To prevent the interference of the metal oxide formed on the surface of the metal pad 232 and to ensure good contact between the probe tip and the metal pad 232, the probe tip 130 begins to laterally move a short distance on the surface of the metal pad 232. This action results in an uplifted probe mark 236, but the height of the probe mark 236 is limited by the stop cylinder 132, for example, the height of the probe mark 236 is below 3 microns. Thereafter, a pressure is exerted on the stop cylinder 132 to force the stop cylinder 132 to press the probe mark 236 to 1 micron height, as shown in FIG. 4*d*. The novel probe tip 130 can control the height of the protruding probe mark 236. It is noted that, in accordance with the preferred embodiment of the present invention, when the needle body 131 retracts inside the stop cylinder 132, the distal end of the needle body 131 still protrudes from the bottom of the stop cylinder 132 by about 1 micron.

Figure 4E:
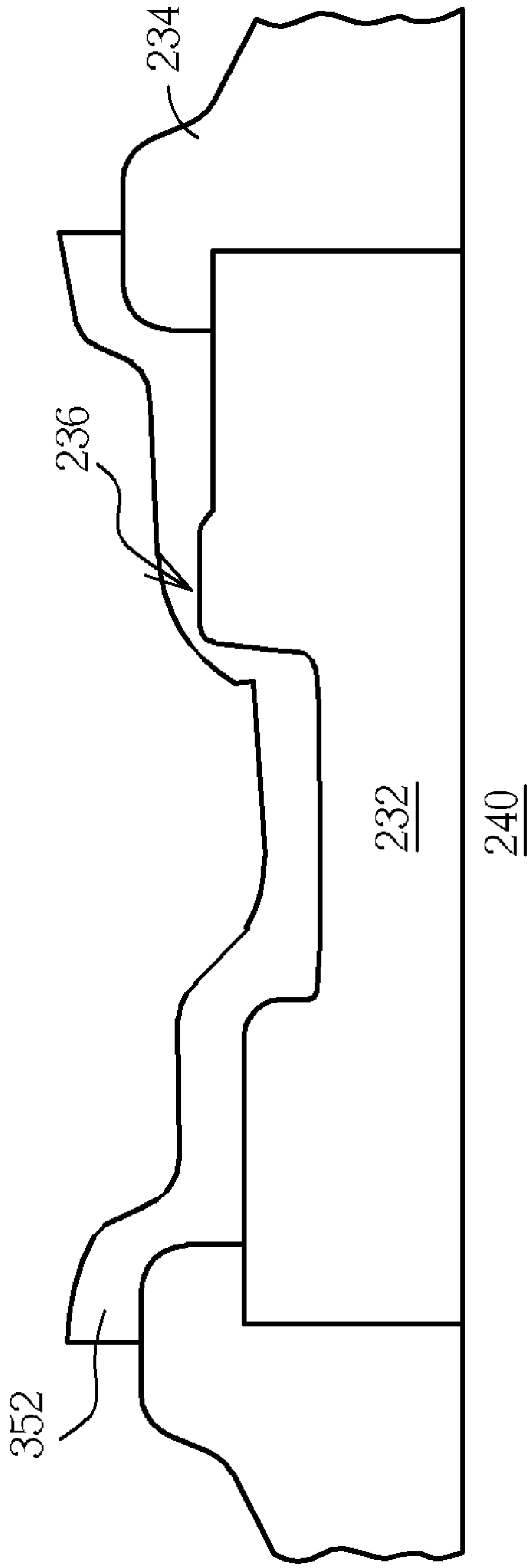
FIG. 4*e* and FIG. 4*f* illustrate the bumping process.
Figure 4F:
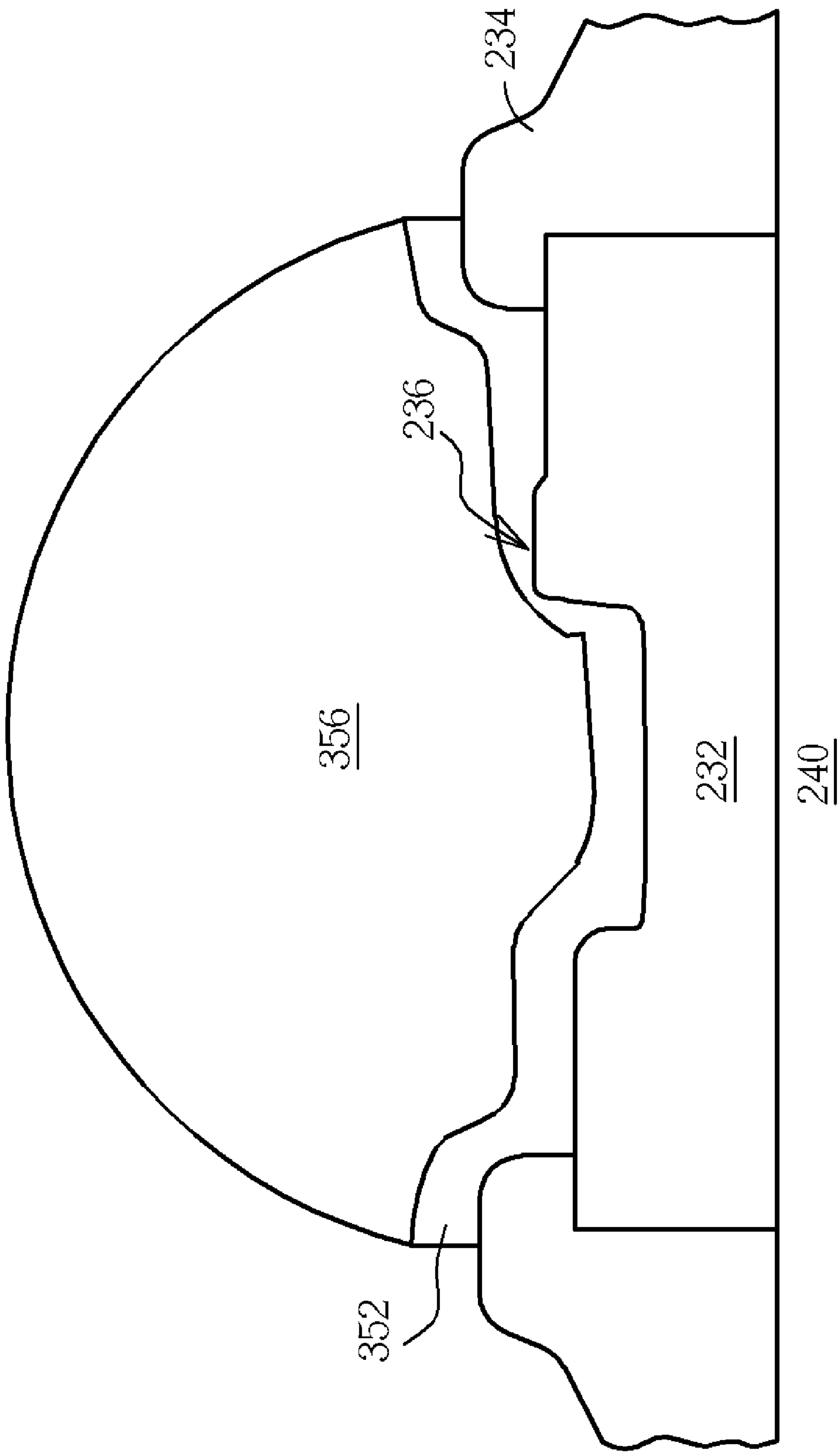

FIG. 4*e* and FIG. 4*f* illustrate the following bumping process. As shown in FIG. 4*e*, an under bump metallurgy (UBM) 352 is formed on the surface of the metal pad 232. The formation of the UBM 352 is known in the art. Typically, the UBM 352 comprises an adhesion layer made of Ti, Cr, or Al, a diffusion barrier layer such as Cu, Ni, or TiW alloy, and a wetting layer such as Cu, Ni, Au, or Ag, but not limited thereto. As mentioned, the thickness of the UBM 352 is about 1 micron to 2 microns. The pressed probe mark

36 having a height of below 2 microns will not protrude from the surface of the UBM 352. Further, since the probe mark is pressed, void is eliminated. As shown in FIG. 4f, a solder bump 356 is thereafter formed on the UBM 352.

To sum up, the present invention provides a new and reliable flip-chip packaging process flow incorporating with an improved probing test process. A novel probe tip design is utilized in the probing test process. With the novel probe tip design of the present invention, the proposed new flip-chip packaging process flow is practical.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flip-chip packaging process comprising:

providing a chip having thereon at least one metal pad surface;

providing a probe tip comprising a needle body and a stop cylinder having a recess for accommodating the needle body therein, the needle body being electrically connected to the stop cylinder via a resilient conductive material;

laterally moving the needle body of the probe tip to scratch a portion of the metal pad surface so as to form a protruding probe mark thereon;

pressing the protruding probe mark to a predetermined height with the stop cylinder;

forming a under bump metallurgy (UBM) over the metal pad surface; and forming a bump over the UBM.

2. The flip-chip packaging process of claim 1 wherein the predetermined height is below 2 microns.

3. The flip-chip packaging process of claim 1 wherein the predetermined height is below 1 microns.

4. The flip-chip packaging process of claim 1 wherein the bump is solder bump.

5. The flip-chip packaging process of claim 1 wherein the metal pad is made of aluminum or copper and is formed on a chip.

6. The flip-chip packaging process of claim 1 wherein the needle body protrudes from the bottom of the stop cylinder by at least 1 micron.

7. The flip-chip packaging process of claim 1 wherein the resilient conductive material is conductive glue.

8. The flip-chip packaging process of claim 1 wherein the annual flat bottom has a width of about 20 microns to 30 microns.

* * * * *